(12) United States Patent
Peschke

(10) Patent No.: US 8,890,497 B2
(45) Date of Patent: Nov. 18, 2014

(54) ELECTRONIC DEVICE AND METHOD FOR A LIMITER IN AN AC APPLICATION

(75) Inventor: Carlo Peschke, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 377 days.

(21) Appl. No.: 13/410,105

(22) Filed: Mar. 1, 2012

(65) Prior Publication Data

US 2012/0223695 A1    Sep. 6, 2012

(30) Foreign Application Priority Data

Mar. 4, 2011  (DE) .................. 10 2011 013 105

(51) Int. Cl.
*G05F 1/00*  (2006.01)
*H03G 11/00*  (2006.01)

(52) U.S. Cl.
CPC ..................................... *H03G 11/00* (2013.01)
USPC ........................................................ 323/271

(58) Field of Classification Search
CPC .................................. H03G 11/00; G05F 3/08
USPC ......... 323/233, 268, 271, 273–276, 299, 303, 323/223–226
See application file for complete search history.

(56) References Cited

U.S. PATENT DOCUMENTS

| 5,459,425 | A | 10/1995 | Yasuda |
| 5,786,685 | A | 7/1998 | Lange et al. |
| 6,229,443 | B1 | 5/2001 | Roesner |
| 6,542,344 | B1* | 4/2003 | Mashiko ............... 361/93.9 |
| 2005/0134435 | A1 | 6/2005 | Koyama et al. |
| 2010/0253315 | A1 | 10/2010 | Nehrig et al. |
| 2012/0032659 | A1* | 2/2012 | Kurosawa et al. ........... 323/282 |

FOREIGN PATENT DOCUMENTS

EP    1045325    6/2007

OTHER PUBLICATIONS

PCT Search Reprot mailed Sep. 28, 2012.
DE Search Report mailed Nov. 2, 2011.

* cited by examiner

*Primary Examiner* — Matthew Nguyen
(74) *Attorney, Agent, or Firm* — William B. Kempler; Frederick J. Telecky, Jr.

(57) ABSTRACT

An electronic device, including a first limiter including a first transistor configured to be coupled with a first side of a channel to a first output node of a non-ideal voltage source having an inner impedance greater zero in order to limit the voltage at the first output node by drawing a current from the first output node. The second side of the channel of the first transistor is coupled to a capacitor so as to supply a current from the first output node to the capacitor, if the voltage level at the output node reaches or exceeds an upper limit.

11 Claims, 3 Drawing Sheets

ELECTRONIC DEVICE AND METHOD FOR A LIMITER IN AN AC APPLICATION

CROSS-REFERENCE TO RELATED APPLICATIONS

This patent application claims priority from German Patent Application No. 10 2011 013 105.1, filed Mar. 4, 2011, which is incorporated herein by reference in its entirety.

FIELD OF THE INVENTION

The invention relates to an electronic device comprising a limiter and a method of limiting an output voltage of a voltage source.

BACKGROUND OF THE INVENTION

There are many applications which require limiting voltage levels of alternating or oscillating voltage sources.

FIG. 1 shows a simplified circuit diagram of a limiter according to the prior art. There is a voltage source VS represented by an ideal voltage source VC and an impedance RI. The voltage source VS may be, e.g. an oscillator, and most specifically, an oscillator in an RFID application. The output of the voltage source VS is applied to electronic components. A first transistor P1 is coupled with its channel between the output node OUT and ground. A second transistor N1 is coupled with its channel between the output node OUT and a supply voltage level VDD. The gates of the first transistor and the second transistor N1 are biased by BIAS voltage levels VBP1 and VBN1 respectively. However, any currents drawn from the output node OUT through transistors N1 or P1 are finally dissipated and contribute to the overall power consumption.

SUMMARY OF THE INVENTION

It is a general object of the invention to provide a limiter and a method for reducing the power consumption of a limiter.

In an aspect of the invention, an electronic device is provided, which comprises a first limiter. The first limiter comprises a first transistor that is coupled with the first side of a channel to a first output node of a first non-ideal voltage source in order to limit the voltage at the first output node by drawing a current from the first output node. The second side of the channel of the first transistor may then be coupled to a capacitor so as to supply a current from the first output node to the capacitor, if the voltage level of the first output node reaches or exceeds an upper limit. Accordingly, a current that is drawn from the first output node through the first transistor is used to charge the capacitor. This allows reuse of the stored charge when the voltage at the output node drops below a lower limit.

The electronic device may further comprise a second transistor coupled with a first side of a channel to a second output node of a non-ideal voltage source in order to limit the voltage at the second output node by supplying a current to the second output node. The second side of the channel of the second transistor may then be coupled to the capacitor so as to supply the current to the second output node from the capacitor through the second transistor, if the voltage level at the second output node reaches or drops below a lower limit.

In another aspect of the invention, the second transistor may be coupled with a first side of a channel to the first output node of the voltage source in order to limit the voltage at the first output node by supplying a current to the first output node. The second side of the channel of the second transistor may then be coupled to the capacitor so as to supply a current to the first output node from the capacitor through the second transistor, if the voltage level at the first output node reaches or drops below a lower limit.

Accordingly, the charge received from the first output node (output node of a first non-ideal voltage source) which is accumulated and stored on the capacitor, is either used to limit the output voltage level of either the same non-ideal voltage source or a different non-ideal voltage source. Both aspects of the invention allow the stored charge to be reused.

The first transistor may be a PMOS transistor and the second transistor may be an NMOS transistor. In an alternative embodiment, the first transistor may be a PNP transistor and the second transistor may be an NPN transistor.

There might be a second limiter which may be configured and coupled to limit the voltage level across the capacitor. This additional limiter may be useful, if the alternating or oscillating voltages from the first or the first and the second voltage source is/are not symmetrical which would then result in a constantly increasing or decreasing voltage across the capacitor.

The invention also provides a method of limiting a voltage at an output node of a voltage source. A current may be drawn from the output node in order to reduce a voltage level at the output node if the voltage level at the output node reaches or exceeds an upper limit. The current may be fed to a capacitor for storing the charge (the charge of the drawn current). The stored charge may be fed back to the output node of the same voltage source or to an output node of a different non-ideal voltage source, if the voltage level at the output node reaches or drops below a lower limit.

BRIEF DESCRIPTION OF DRAWINGS

Further aspects of the invention will appear from the appending claims and from the following detailed description given with reference to the appending drawings.

DETAILED DESCRIPTION OF EXAMPLE EMBODIMENTS

Figure 1:
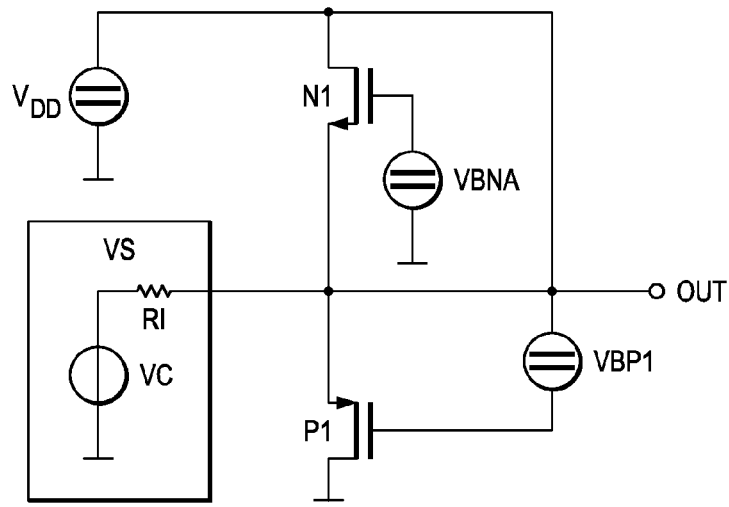
FIG. 1 shows a simplified circuit diagram of a limiter circuit according to the prior art.
Figure 2:
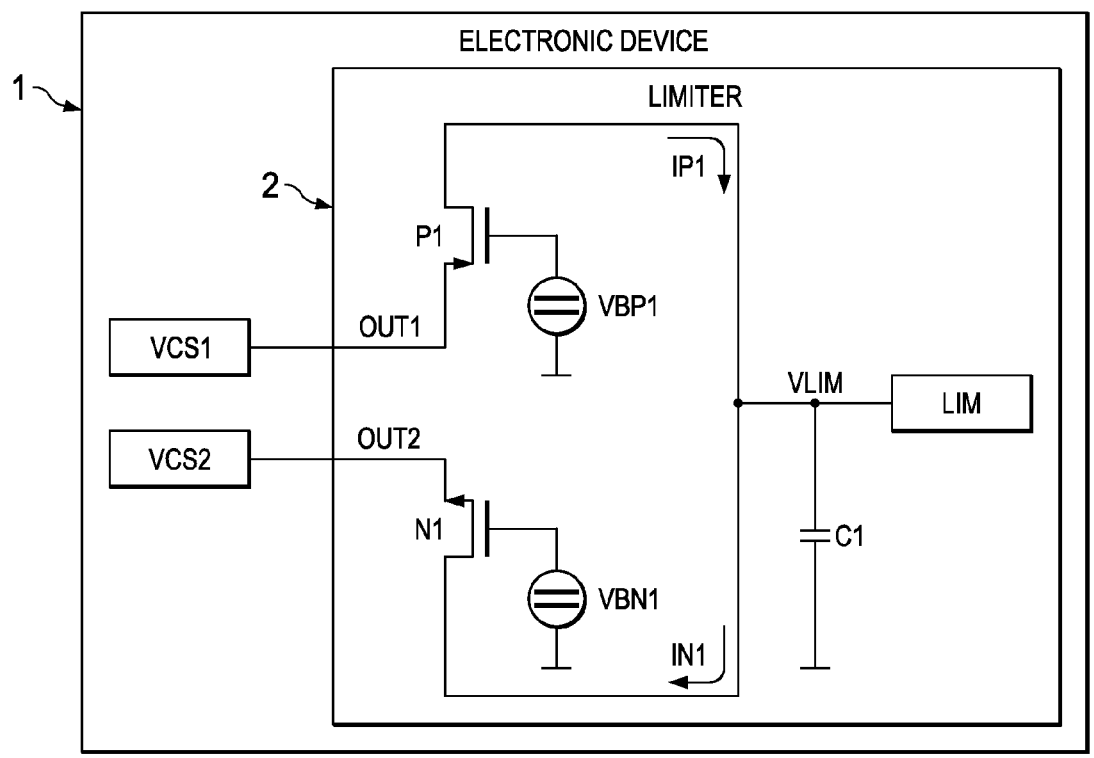
FIG. 2 shows a simplified circuit diagram of an electronic device including a limiter configured for two different voltage sources according to aspects of the invention.

FIG. 2 shows a simplified circuit diagram of an electronic device 1 in accordance with aspects of the invention. The electronic device 1 may be an integrated semiconductor electronic device. The electronic device 1 includes a limiter 2. The limiter 2 comprises a first transistor P1 (PMOS transistor) coupled with a first side (source) of a channel to an output node OUT1 of a voltage source VCS1 in order to limit the voltage at the output node OUT1 by drawing a current IP1 from the output node OUT1. The second side (drain) of the channel of the first transistor P1 is coupled to a capacitor C1 so as to supply a current to the capacitor C1, if the voltage level at the output node reaches an upper limit. The upper limit is defined by a bias voltage source VBP1 which is coupled to the gate of the first transistor P1. The voltage source VCS1 may be any kind of non-ideal voltage source having a certain inner impedance (inner impedance greater than zero).

The limiter 2 further comprises a second transistor (N1) coupled with a first side (source) of a channel to the output node OUT2 of the voltage source VCS2 in order to limit the voltage at the output node OUT2 by supplying a current to the output node OUT2. The second side (drain) of the channel of the second transistor N1 is coupled to the capacitor C1 so as to supply a current IN1 from the capacitor C1 to the output node OUT2, if the voltage level at the output node OUT2 reaches or exceeds a lower limit. The current IN1 may then be the provided from the charge previously fed to and stored on capacitor C1 by current IP1. The lower limit is defined by a bias voltage source VBN1 which is coupled to the gate of the second transistor N1. The voltage source VCS2 may be any kind of non-ideal voltage source having a certain inner impedance (inner impedance greater than zero).

The limiter 2 further comprises another limiter LIM for limiting the voltage at node VLIM across the capacitor C1. This may be necessary to compensate a misbalance of the charges on C1 caused by currents IN1 and IP1. The limiter LIM may be implemented as a buffer.

The output nodes OUT1 and OUT2 may be coupled to further circuitry (not shown) which requires that the voltage levels at the output nodes remain below an upper limit at node OUT1 and a lower limit at node OUT2.

Figure 3:
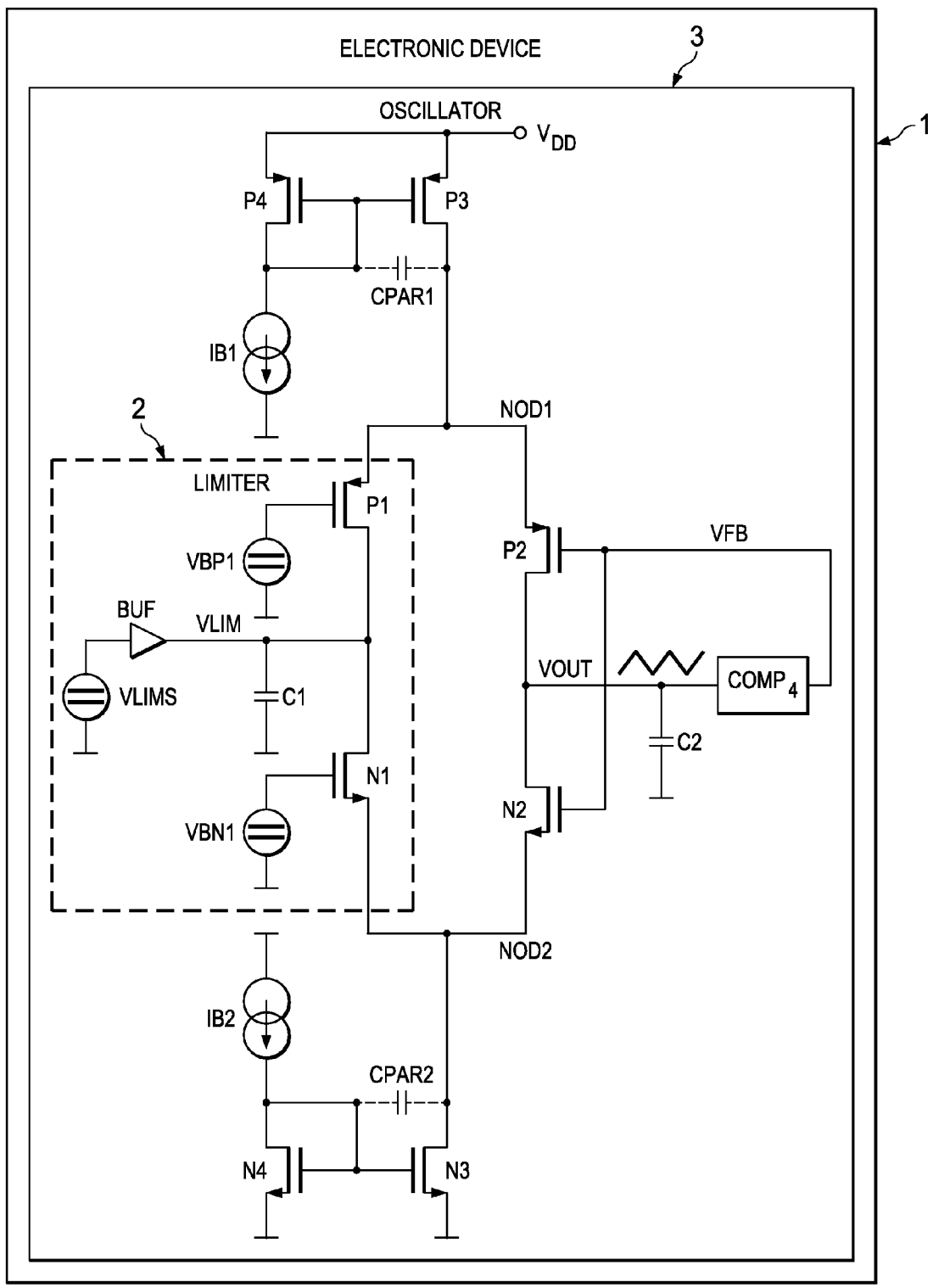
FIG. 3 shows a simplified circuit diagram of another embodiment of an electronic device relating to an oscillator in accordance to aspects of the invention.

FIG. 3 shows a simplified circuit diagram of an electronic device 1 according to aspects of the invention. In this configuration, the electronic device 1 also includes a limiter. However, the limiter is now coupled to an oscillator 3. This configuration may be used for an integrated circuit using an oscillator for producing an internal clock signal for clocking a digital stage. The oscillator comprises a first current source P4, P3, IB1 and a second current source IB2, N4, N3. The first and second current sources are coupled to supply, alternately, equal currents (in opposite directions) through transistors P2 or N2. Transistor P2 is a PMOS transistor and transistor N2 is an NMOS transistor. The gates of transistors P2 and N2 are controlled by a feedback loop comprising a capacitor C2 and a comparator COMP 4. The comparator has a hysteresis with an upper and a lower threshold. The limiter 2 comprises transistors N1, P1, the two bias voltage sources VBP1 and VBN1, the capacitor C1 and the limiter including buffer BUF and a further bias voltage source VLIMS. The limiter 2 is basically configured as shown and explained with respect to FIG. 2.

The output impedance Z of the buffer BUF has to be designed and chosen according to the following considerations. For Z being mainly resistive (Z=R), the impedance may be dimensioned as:

$$R=1/(fcC12\pi) \text{ with } fc<<f,\quad(1)$$

wherein fc is the corner frequency of the buffer coupled to capacitance C1 and f is the signal frequency of the AC voltage source. The impedance Z (=R) of the buffer BUF provides that the buffer BUF is not too fast (fc should be much lower than f) with respect to the frequency f of the AC signal of the voltage source. Otherwise, the buffer BUF would follow and counteract the alternating voltage of the AC voltage source.

However, the corner frequency fc (for example by designing the output impedance Z (=R) of the buffer accordingly) should still be fast enough (fc should not be too small) to allow the buffer BUF to eliminate a misbalance of charges stored on the capacitor C1 during the two different half cycles of the alternating voltage. This aspect is explained in more detail with respect to FIG. 4.

The bias current source IB1 is coupled to the drain of transistor P4. The source of transistor P4 is coupled to VDD. The gate and the drain of transistor P4 are coupled together. The gate of transistor P4 is also coupled to the gate of transistor P3. The source of transistor P3 is coupled to VDD. The drain of transistor P3 is coupled to the sources of transistor P1 and P2. Transistors P3 and P4 are configured in a current mirror configuration. Transistor P4 is diode-coupled. The drain of transistor P2 is coupled to the drain of transistor N2. The source of transistor N2 is coupled to the drain of transistor N3. The source of transistor N3 is coupled to ground. The drain and the gate of transistor N4 are coupled together. This means that transistor N4 is diode-coupled. The source of transistor N4 is coupled to ground. Transistor N4 receives the bias current IB2 from bias current IB2. The gates of transistors N4 and N3 are coupled together. Accordingly, transistors N3 and N4 form a current mirror. The current mirror P3 and P4 feed a bias current (proportional to IB1) to node NOD1. The current mirror N3, N4 feed a bias current (proportional to current IB2) to node NOD2. The voltage at node VOUT (i.e. at the connected drains of P2 and N2) is coupled to one side of capacitor C2. The other side is coupled to ground. The voltage at node VOUT alternates during operation. A comparator COMP4 compares the voltage at node VOUT with an upper and a lower limit. According to the comparison result of comparator COMP4, a gate driving stage GATE 5 is controlled for generating an appropriate feedback signal VFB to be fed to the gates of transistors P2 and N2. This means that during operation, either transistor P2 or transistor N2 are open. If the voltage VOUT reaches the upper threshold voltage of the comparator COMP, feedback signal VFB is changed to a higher voltage level in order to open transistor N2 and close P2. Accordingly, the voltage across capacitor C2 falls until the lower threshold voltage of the comparator COMP is reached. The feedback signal VFB changes to a lower voltage level in order to open transistor P2 and close transistor N2. Accordingly, the voltage level across capacitor C2 rises again. This results in a triangular waveform of output voltage VOUT of the oscillator.

Limiter 2 is configured to prevent the voltage levels at nodes NOD1 and NOD2 to increase or decrease beyond upper and lower limits, respectively. If the voltage level at node NOD1 increases too much, this may result in a voltage level between VDD and NOD1 that is below the saturation voltage of transistor P3. This could result in a charge injection into node NOD1, when the voltage level at NOD1 falls again.

The same could occur for the current mirror N3, N4, if the voltage level at node NOD2 drops below the saturation voltage of N3. If the voltage level increases again, a charge injection could occur.

In order to limit the voltage levels at nodes NOD1 or NOD2, a certain amount of current is drawn from or fed into these nodes in order to limit the maximum or minimum voltage levels. However, if this current was fed to ground or to supply voltage level, the currents could be lost and the overall power consumption would be increased.

Instead of feeding the power through P1 or N1 to ground or supply voltage level, the currents are used to charge and discharge capacitor C1. If the voltage level at NOD1 reaches a certain upper voltage limit, a current is fed through transistor P1 to node VLIM, thereby charging capacitor C1. This limits the voltage level at NOD1 to an upper limit. If the voltage level at node NOD2 drops to a certain lower limit, a current is drawn from node VLIM (i.e. charge is drawn from capacitor C1, through transistor N1 in order to compensate the missing charge at node NOD2 and to limit the voltage level at node NOD2 to a lower limit). Limiter 2 also includes a further limiter with a voltage source VLIMS and buffer BUF. This provides that the DC voltage at node VLIM and across capacitor C1 remains constant.

The embodiments shown in FIG. 2 and FIG. 3 relate to configurations in which the current is drawn from an output node of one voltage source and fed to an output node of another voltage (current) source. In the embodiment shown in FIG. 3, one output node is NOD1 and the other output node is NOD2.

Figure 4:
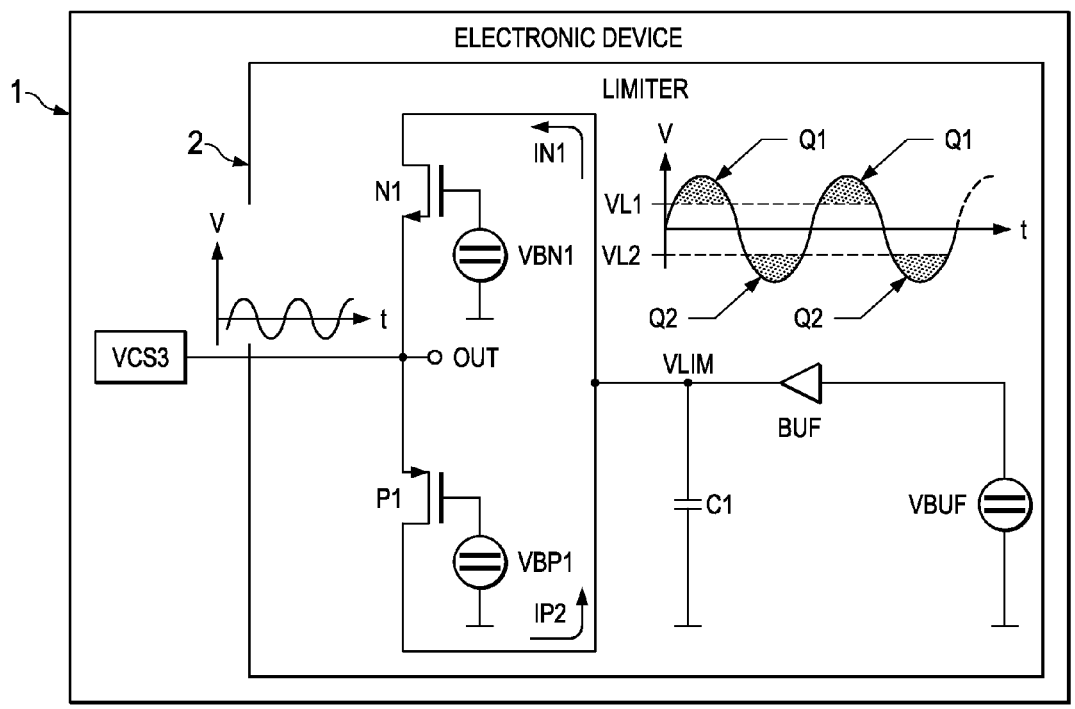
FIG. 4 shows another embodiment of an electronic device according to aspects of the invention.

FIG. 4 shows a simplified circuit diagram of an electronic device 1 in accordance with aspects of the invention. The electronic device 1 may be an integrated semiconductor electronic device. There is now only a single voltage source VCS 3, which may include a certain inner impedance RI (not shown). The single voltage source VCS 3 replaces the two voltage sources VCS1 and VCS2 shown in FIG. 2. The output of the voltage source VCS 3 is coupled to an output node OUT which may then be used for supplying other stages and electronic components of the electronic device 1. The electronic device 1 primarily includes a limiter 2. Limiter 2 includes a first transistor P1, which is a PMOS transistor in this embodiment. The channel of the PMOS transistor P1 is coupled between the output node OUT and one side of a capacitor C1 (i.e. between node OUT and one side of a capacitor C1, between node OUT and node VLIM). The other side of the capacitor C1 is coupled to ground. There is a second transistor N1, which is an NMOS transistor in this embodiment. The channel of the second transistor N1 is coupled between the output node OUT and the same side of C1 to which the channel of transistor P1 is coupled (i.e. to node VLIM). The control gate of the first transistor P1 is biased with a biasing voltage VBP1. The control gate of the second transistor N1 is biased with a biasing voltage VBN1.

The first transistor P1 and the second transistor N1 are now coupled and configured to charge and discharge the capacitor C1 if the voltage at the output node OUT exceeds an upper limit VL1 or a lower limit VL2 shown in the diagram in the right upper corner of FIG. 4. If the voltage level at node OUT reaches or exceeds the upper limit VL1, transistor P1 opens and a current flows to node VLIM (i.e. to capacitor C1). The bias voltage VBP1 is chosen, such that the gate-source voltage of P1 exceeds the threshold level if the voltage level at node OUT exceeds the upper limit VL1. Furthermore, if the voltage level at node OUT reaches or drops below the lower limit VL2, the second transistor N1 opens and a current is supplied from the capacitor C1 to node OUT. This increases the voltage at node OUT and provides that the voltage may drop below VL2. The power dissipation is then limited to the losses in transistors N1, P1, the voltage source 3 and maybe some other parasitic effects.

Furthermore, if the voltage level at node OUT reaches or drops below the lower limit VL2, the second transistor N1 opens and a current is supplied from the capacitor C1 to node OUT. This increases the voltage at node OUT and provides that the voltage may drop below VL2. The power dissipation is then limited to the losses in transistors N1, P1, the voltage source 3 and maybe some other parasitic effects.

Furthermore, there is a limiter stage or buffer, including a buffer BUF and a further bias voltage source VBUF. The output of the buffer BUF is coupled to one side of the capacitor C1 (i.e. to node VLIM). The input of the buffer BUF is coupled to the biased voltage source VBUF. This configuration provides that the voltage level at node VLIM (i.e. across capacitor C1) may not exceed an upper limit even if the voltage source 3 produces an alternating or oscillating voltage which is not symmetrical.

The output impedance Z of the buffer BUF has to be designed and chosen according to the same consideration as explained with respect to FIG. 3. The impedance should be chosen according to equation (1). However, as indicated in FIG. 4 above buffer BUF, the charge stored on capacitor C1 during a first half cycle is Q1. The charge stored during the second half cycle is Q2. In Q1=Q2, the charges compensate each other during each period or full cycle of the alternating output voltage of the voltage source VCS3. However, if the currents IN1 and IP2 contribute different amounts of charges (Q1 is not equal to Q2) the voltage on node VLIM may smoothly rise or fall. This effect should be eliminated by buffer BUF. The output impedance Z (here also shown for a mainly resistive impedance, i.e. Z=R) should therefore also be chosen according to the following conditions:

$$R < T|VL1 - VBUF|/|Q1 - Q2| \quad (2)$$

and $$R < T|VL2 - VBUF|/|Q1 - Q2| \quad (3).$$

R (=Z) is the output impedance of the buffer BUF, T is the period of the alternating voltage of the AC voltage source VCS3 (T=1/f), VL1 is the upper limit and VL2 is the lower limit for the alternating voltage. Q1 is the charge of the first half cycle and Q2 is the charge of the second half cycle. If both conditions are fulfilled and also equation (1), the buffer BUF in combination with C1 is still fast enough to compensate any misbalance between Q1 and Q2.

The corner frequency fc (for example by designing the output impedance Z of the buffer accordingly) should still be fast enough (fc should not be too small) to allow the buffer BUF to eliminate a misbalance of charges stored on the capacitor C1 during the two different half cycles of the alternating voltage. This aspect is explained in more detail with respect to FIG. 4.

Figure 5:
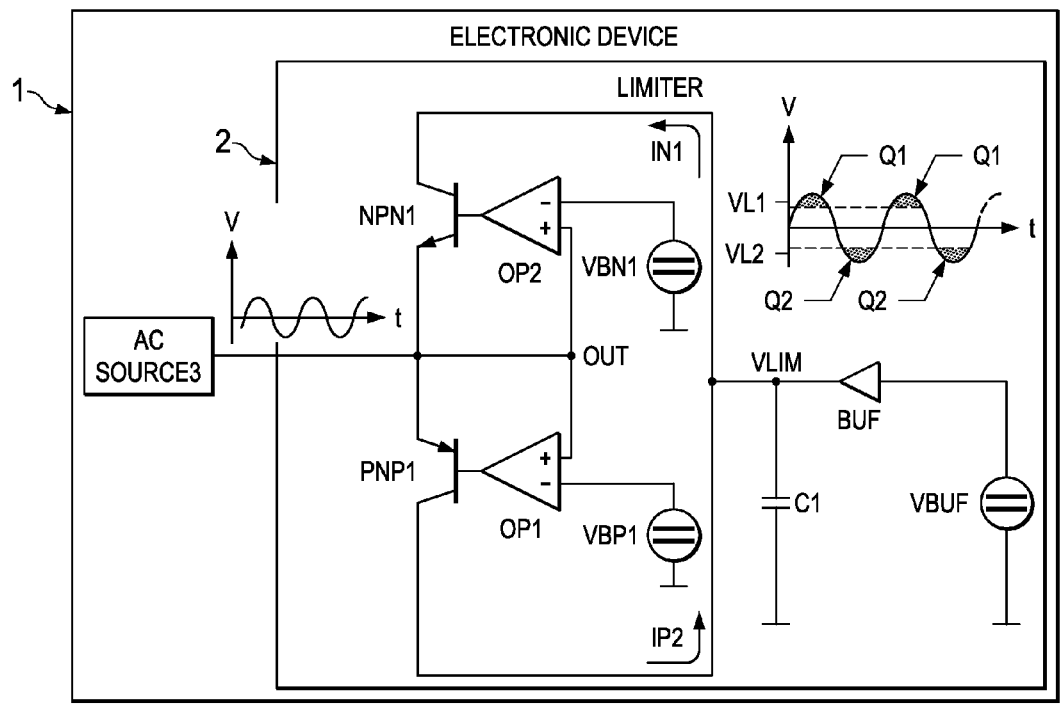
FIG. 5 shows another embodiment of an electronic device according to aspects of the invention.

FIG. 5 shows a simplified circuit diagram of another embodiment of an electronic device 1 according to aspects of the invention. Similar to the embodiments shown in FIG. 4, there is an AC source 3 being modeled with an ideal voltage source VAC and an inner impedance RI. The AC voltage source 3 may be any stage using an alternating or oscillating output voltage at node OUT. Instead of the MOS transistors N1 and P1 of the embodiment of FIG. 4, there are now NPN and PNP transistors used for limiting the output voltage at node OUT. There is a first transistor PNP1 being coupled with its emitter to node OUT and with its collector to node VLIM. There is a second transistor NPN1 being coupled with its emitter to the output node OUT and with its collector to node VLIM. The base of the second transistor NPN1 is coupled to an output of a second operational amplifier OP2. The base of the first transistor PNP1 is coupled to the output of a first operational amplifier OP1. The inverted input of operational amplifier OP1 is coupled to a bias voltage source VBP1 and the inverted input of the second operational amplifier OP2 is coupled to a bias voltage source VBN1. The non-inverting inputs of the operational amplifier OP1 and OP2 are coupled to output node OUT. There is a capacitor C1 coupled to node VLIM. Furthermore, there is a limiter including buffer BUF (which may be an operational amplifier coupled as non-inverting voltage follower) and a voltage source VLIMS. The buffer BUF limits the voltage level at node VLIM. The output impedance Z of the buffer BUF has to be designed in accordance with equations (1) to (3) as described with respect to FIG. 3 and FIG. 4.

Although the invention has been described in detail, it should be understood that various changes, substitutions and alterations may be made thereto without departing from the spirit or scope of the invention as defined by the appended claims.

The invention claimed is:

1. An electronic device comprising:
   a first limiter including a first transistor configured to be coupled with a first side of a channel to a first output node of a non-ideal voltage source having an inner impedance greater zero in order to limit the voltage at the first output node by drawing a current from the first output node, wherein the second side of the channel of the first transistor is coupled to a capacitor so as to supply a current from the first output node to the capacitor, if the voltage level at the output node reaches or exceeds an upper limit, wherein the first limiter further comprises a second transistor configured to be coupled with a first side of a channel to a second output node of a second non-ideal voltage source in order to limit the voltage at the second output node, wherein the second side of the channel of the second transistor is coupled to the capacitor so as to supply a current from the capacitor to the second output node, if the voltage level at the second output node reaches or exceeds a lower limit.

2. An electronic device comprising:
   a first limiter including a first transistor configured to be coupled with a first side of a channel to a first output node of a non-ideal voltage source having an inner impedance greater zero in order to limit the voltage at the first output node by drawing a current from the first output node, wherein the second side of the channel of the first transistor is coupled to a capacitor so as to supply a current from the first output node to the capacitor, if the voltage level at the output node reaches or exceeds an upper limit, wherein the first limiter further comprises a second transistor configured to be coupled with a first side of a channel to the first output node in order to limit the voltage at the first output node, wherein the second side of the channel of the second transistor is coupled to the capacitor so as to supply a current from the capacitor to the first output node, if the voltage level at the output node reaches or exceeds a lower limit.

3. The electronic device according to claim 1, further comprising a second limiter coupled to the capacitor for limiting the voltage across the capacitor.

4. The electronic device according to claim 1, wherein the first transistor is a PMOS transistor and the second transistor is a NMOS transistor.

5. The electronic device according to claim 1, wherein the first transistor is a PNP transistor and the second transistor is an NPN transistor.

6. The electronic device according to claim 1, wherein the inner resistive impedance is chosen from the equations:

$$R < T|VL1 - VBUF|/|Q1 - Q2|$$

and $$R < T|VL2 - VBUF|/|Q1 - Q2|$$

where R (=Z) is the output impedance of the buffer BUF, T is the period of the alternating voltage of the AC voltage source VCS3 (T=1/f), VL1 is the upper limit and VL2 is the lower limit for the alternating voltage, Q1 is the charge of the first half cycle and Q2 is the charge of the second half cycle.

7. A method of limiting a voltage of a non-ideal voltage source, the method comprising:
   drawing a current from a first output node of the voltage source through a first transistor in order to limit a voltage level at the first output node to an upper limit;
   feeding the current to a capacitor for storing a charge; and
   feeding a charge stored on the capacitor back through a second transistor to so as to limit a voltage level if the voltage level reaches or exceeds a lower limit, wherein the charge stored on the capacitor is fed back to the first output node.

8. The electronic device according to claim 2, further comprising a second limiter coupled to the capacitor for limiting the voltage across the capacitor.

9. The electronic device according to claim 2, wherein the first transistor is a PMOS transistor and the second transistor is a NMOS transistor.

10. The electronic device according to claim 2, wherein the first transistor is a PNP transistor and the second transistor is an NPN transistor.

11. The electronic device according to claim 2, wherein the inner resistive impedance is chosen from the equations:

$$R < T|VL1 - VBUF|/|Q1 - Q2|$$

and $$R < T|VL2 - VBUF|/|Q1 - Q2|$$

where R (=Z) is the output impedance of the buffer BUF, T is the period of the alternating voltage of the AC voltage source VCS3 (T=1/f), VL1 is the upper limit and VL2 is the lower limit for the alternating voltage, Q1 is the charge of the first half cycle and Q2 is the charge of the second half cycle.

* * * * *